(12) United States Patent
Lee

(10) Patent No.: US 10,304,975 B2
(45) Date of Patent: May 28, 2019

(54) IMAGE SENSOR HAVING LIGHT REFRACTIVE PATTERNS

(71) Applicant: SK hynix Inc., Gyeonggi-do (KR)

(72) Inventor: Kyoung-In Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/681,688

(22) Filed: Aug. 21, 2017

(65) Prior Publication Data

US 2018/0204961 A1     Jul. 19, 2018

(30) Foreign Application Priority Data

Jan. 18, 2017 (KR) .................. 10-2017-0008474

(51) Int. Cl.
*H01L 31/0232* (2014.01)
*H01L 27/146* (2006.01)

(52) U.S. Cl.
CPC ...... *H01L 31/02325* (2013.01); *H01L 27/146* (2013.01); *H01L 27/1464* (2013.01); *H01L 27/14612* (2013.01); *H01L 27/14623* (2013.01); *H01L 27/14629* (2013.01); *H01L 27/14638* (2013.01); *H01L 27/14645* (2013.01); *H01L 27/14685* (2013.01)

(58) Field of Classification Search
CPC ......... H01L 31/02325; H01L 27/14685; H01L 27/14645; H01L 27/14612; H01L 27/14638; H01L 27/14629; H01L 27/14623; H01L 27/1464; H01L 27/146
See application file for complete search history.

(56) References Cited

U.S. PATENT DOCUMENTS

| 6,010,647 | A | * | 1/2000 | Nomura | ........... | B29D 11/00028 |
| | | | | | | 264/1.8 |
| 2003/0067688 | A1 | * | 4/2003 | Wang | ................... | G02B 3/0012 |
| | | | | | | 359/652 |
| 2007/0125935 | A1 | * | 6/2007 | Yaung | ............... | H01L 27/14621 |
| | | | | | | 250/208.1 |
| 2009/0256225 | A1 | * | 10/2009 | Nakai | ............... | H01L 27/14623 |
| | | | | | | 257/432 |
| 2015/0364511 | A1 | * | 12/2015 | Echizen | ........... | H01L 27/14643 |
| | | | | | | 257/432 |

FOREIGN PATENT DOCUMENTS

| KR | 1020070075567 | 7/2007 |
| KR | 1020100076715 | 7/2010 |
| KR | 1020100079203 | 7/2010 |
| KR | 1020110079288 | 7/2011 |
| KR | 1020120063855 | 6/2012 |

OTHER PUBLICATIONS

Kobayashi, M. et al., A Low Noise and High Sensitivity Image Sensor with Imaging and Phase-Difference Detection AF in All Pixels, 2016, pp. 123-128, ITE Trans. On MTA vol. 4, No. 2.

* cited by examiner

*Primary Examiner* — Su C Kim
(74) *Attorney, Agent, or Firm* — IP & T Group LLP

(57) ABSTRACT

An image sensor is provided. The image sensor may include a photodiode formed in a substrate; a light refraction pattern formed on the photodiode; a color filter covering the light refraction pattern; and a micro-lens formed on the color filter.

18 Claims, 13 Drawing Sheets

IMAGE SENSOR HAVING LIGHT REFRACTIVE PATTERNS

CROSS-REFERENCE TO RELATED APPLICATIONS

The present application claims priority to Korean Patent Application No. 10-2017-0008474, filed on Jan. 18, 2017, which is incorporated herein by reference in its entirety.

BACKGROUND

1. Field

Exemplary embodiments of the present invention relate to an image sensor and, more particularly, to an image sensor including light refraction patterns capable of changing a light propagation direction.

2. Description of the Related Art

Recently, with the development of the information communication industries and the digitalization of electronic devices, enhanced image sensors have been used in various fields such as a digital camera, a camcorder, a mobile phone, a PCS (Personal Communication System), a game machine, a security camera, and a medical micro-camera. In general, an image sensor includes a pixel region including photodiodes and a peripheral circuit region. A unit pixel includes a photodiode and a transfer transistor. The transfer transistor is disposed between the photodiode and a floating diffusion region to transmit a charge generated by the photodiode to the floating diffusion region.

When an incident angle of the light incident on pixels of an image sensor is increased, the auto-focus function of the image sensor is degraded, and crosstalk between the pixels deteriorates. Accordingly, more research is needed to reduce the incident angle of the light.

SUMMARY

Embodiments of the present invention are directed to an image sensor capable of controlling the incident angle of light incident on the pixels to reduce cross-talk between the pixels and improve the auto-focus function of the image sensor.

Various embodiments are directed to an image sensor employing at least one light refraction pattern for controlling the incident angle.

Various embodiments of the present invention are directed to a method for making an image sensor having at least one light refraction pattern.

In an embodiment an image sensor may include a photodiode formed in a substrate; a light refraction pattern formed on the photodiode; a color filter covering the light refraction pattern; and a micro-lens formed on the color filter.

The photodiode may include a left photodiode and a right photodiode isolated from each other by a PD isolation region. The light refraction pattern may be vertically aligned with the PD isolation region.

The PD isolation region and the light refraction pattern may extend in the same direction in a top view.

The light refraction pattern may include a center refraction pattern and side refraction patterns on both sidewalls of the center refraction pattern. The center refraction pattern may be centrally aligned over the PD isolation region and partially extend over the left and the right photodiode The center refraction pattern may have a first optical refractive index. The side refractive patterns may have a second optical refractive index. The first optical refractive index may be less than the second refractive index.

The center refraction pattern may have a convex top surface, vertical, flat side surfaces and a flat bottom surface.

Each of the side refractive patterns may have three surfaces, a first flat bottom surface in contact with the top surface of the right or the left photodiode, a second vertical flat side surface in contact with one of the vertical side surfaces of the center refraction pattern, and a third concave side surface. The overall shape of the light refraction pattern may have the shape of one half of an ellipse.

The side refractive patterns may have a spacer shape which an upper horizontal width may be relatively narrow and a lower horizontal width may be wider. Inner sides of the side refraction patterns may be vertically flat. Outer sides of the side refraction patterns may be curved.

In an embodiment of the inventive concepts an image sensor may include a PD isolation region in a substrate; a left photodiode and a right photodiode isolated by the PD isolation region; a light refraction pattern in the substrate to be vertically aligned and overlapped with the PD isolation region; and a color filter and a micro-lens covering the light refraction pattern. The light refraction pattern may include a center refraction pattern and side refraction patterns on sidewalls of the center both light refraction pattern.

The center refraction pattern may be partially vertically aligned and overlapped with the PD isolation region, the left photodiode, and the right photodiode.

The side refraction patterns may be vertically aligned and overlapped with one of the left photodiode and the right photodiode, respectively.

In an embodiment of the inventive concepts, a method for forming an image sensor, may include forming a PD isolation region in a substrate to define a left photodiode and a right photodiode; forming a light refraction pattern on a top surface of the substrate to be vertically aligned with the PD isolation region; forming a color filter covering the light refraction pattern; and forming a micro-lens on the color filter.

The forming the light refraction pattern may include forming a first insulating pattern on the top surface of the substrate; forming a second insulating pattern on sidewalls of the first insulating pattern; and patterning the first insulating pattern and the second insulating patterns.

The first insulating pattern may have an optical refractive index relatively less than that of the second insulating pattern.

The light refraction pattern may include a center refraction pattern formed by patterning the first insulating pattern and side refraction patterns formed by patterning the second insulating patterns.

The center refraction pattern may be partially vertically aligned with the PD isolation region, the left photodiode, and the right photodiode.

The side refraction patterns may be vertically aligned with one of the left photodiode and the right photodiode, respectively.

The forming the light refraction pattern may include forming a mask pattern on the first insulating pattern and the second insulating pattern, and patterning the first insulating pattern and the second insulating pattern by performing an etching process using the mask pattern as an etching mask.

The forming the mask pattern may include forming an organic pattern on the first insulating pattern and the second insulating pattern, and reflowing the organic pattern.

The light refraction pattern may extend with the PD isolation region in the same direction in a top view.

DETAILED DESCRIPTION

Figure 1:
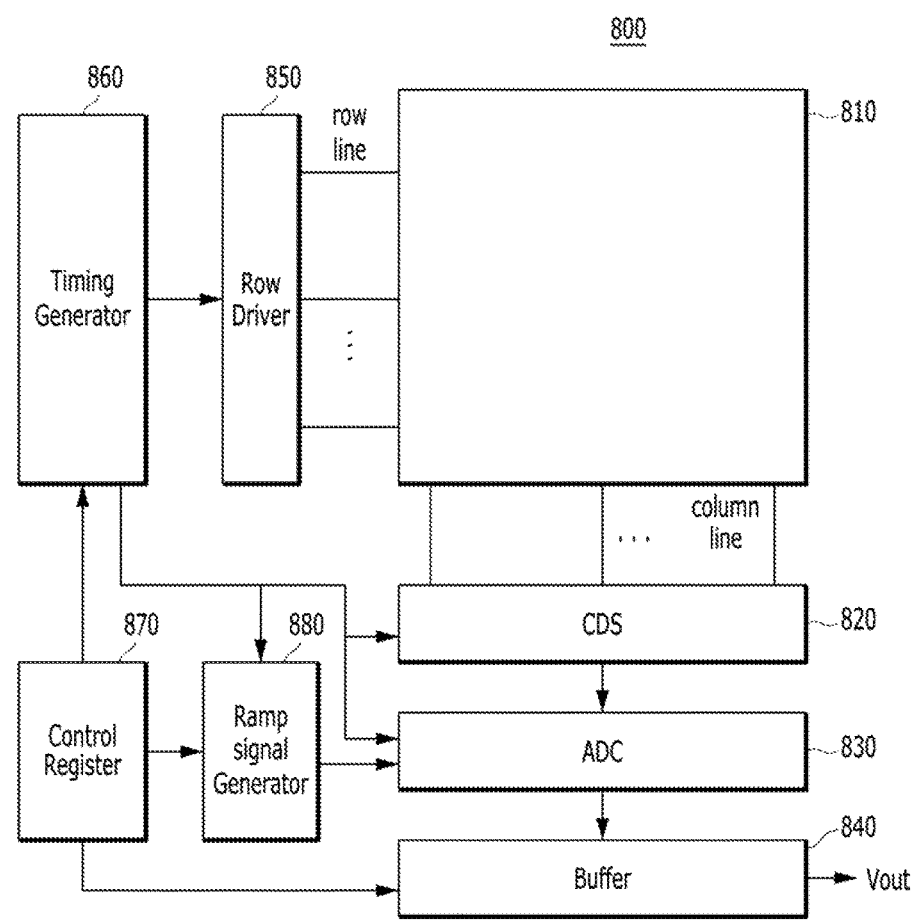
FIG. 1 is a block diagram illustrating an image sensor in accordance with an embodiment of the present invention.

Various embodiments will be described below in more detail with reference to the accompanying drawings. The present invention may, however, be embodied in different forms and should not be construed as being limited to the embodiments set forth herein. Rather, these embodiments are provided so that this disclosure will be thorough and complete and will fully convey the scope of the present invention to those skilled in the art.

The terms used in this specification are only used for describing exemplary embodiments, and do not limit the present invention. The terms of a singular form may include plural forms unless referred to the contrary. The meaning of 'comprise' and 'comprising' used in this specification specifies a component, step, operation, and/or element but does not exclude other components, steps, operations, and/or elements.

When one element is referred to as being 'connected to' or 'coupled to' another element, it may indicate that the former element is directly connected or coupled to the latter element or another element is interposed therebetween. On the other hand, when one element is referred to as being 'directly connected to' or 'directly coupled to' another element, it may indicate that no element is interposed therebetween. Furthermore, 'and/or' includes each of described items and one or more combinations thereof.

The terms such as 'below', 'beneath', 'lower', 'above' and 'upper', which are spatially relative terms, may be used to describe the correlation between one element or components and another element or other components as illustrated in the accompanying drawings. The spatially relative terms should be understood as terms including different directions of elements on use or operation, in addition to directions illustrated in the drawings. For example, when an element illustrated in a drawing is turned over, the element which is referred to as being 'below' or 'beneath' another element may be positioned above the another element.

Moreover, embodiments of this specification will be described with reference to cross-sectional views and/or plan views which are simplified views for the present invention. In the drawings, the thicknesses of layers and regions may be exaggerated for clarity of illustration. Thus, the illustrated views may be modified depending on fabrication techniques and/or allowable errors. Therefore, the present embodiments are not limited to specific shapes illustrated in the drawings, but may include other shapes which are created according to a fabrication process. For example, an angled region may have a curved shape or a certain curvature. Therefore regions exemplified in the drawings have rough properties, and the shapes of the regions are used to exemplify specific shapes of element regions. Thus, the shapes of the regions do not limit the scope of the inventive concepts.

Throughout the specification, like reference numerals refer to the same elements. Therefore, although the same or similar reference numerals are not mentioned or described in the corresponding drawing, the reference numerals may be described with reference to other drawings. Furthermore, although elements are not represented by reference numerals, the elements may be described with reference to other drawings.

FIG. 1 is a block diagram illustrating an image sensor 800 in accordance with an embodiment of the present invention. Referring to FIG. 1, the image sensor 800 may include a pixel array 810, a correlated double sampler (CDS) 820, an analog-to-digital converter (ADC) 830, a buffer 840, a row driver 850, a timing generator 860, a control register 870, and a ramp signal generator 880.

The pixel array 810 may include a plurality of pixels (not shown) that are arrayed in a matrix structure. Each of the pixels may convert optical image data into electrical image signals and transfer the electrical image signals to the correlated double sampler 820 through column lines. Each of the pixels may be coupled to one of a plurality of row lines and one of a plurality of column lines.

The correlated double sampler 820 may hold and sample the electrical image signals that are received from the pixels of the pixel array 810. For example, the correlated double sampler 820 may sample the voltage level of a received electrical image signal and a reference voltage level based on a clock signal provided by the timing generator 860, and produce an analog signal corresponding to the difference between the two voltage levels to transmit to the analog-to-digital converter 830.

The analog-to-digital converter 830 may convert the received analog signal into digital signal and transfer the digital signal to the buffer 840.

The buffer 840 may latch the digital signal received from the analog-to-digital converter 830 and sequentially output the latched digital signal Vout to an image signal processing unit (not shown). In an embodiment, the buffer 840 may include a memory for latching the digital signal, and a sense amplifier for amplifying the digital signal.

The row driver 850 may drive the pixels of the pixel array 810 according to a timing signal received from the timing generator 860. For example, the row driver 850 may generate a selection signal for selecting one row line of the plurality of row lines and/or a driving signal for driving one row line of the plurality of row lines.

The timing generator 860 may generate timing signals for controlling the correlated double sampler 820 the analog-to-digital converter 830, the row driver 850, and the ramp signal generator 880.

The control register 870 may generate control signals for controlling the buffer 840, the timing generator 860, and the ramp signal generator 880.

The ramp signal generator 880 may generate a ramp signal for controlling an image signal provided from the analog-to-digital convertor 830 to the buffer 840 under the control of the timing generator 860.

Figure 2A:
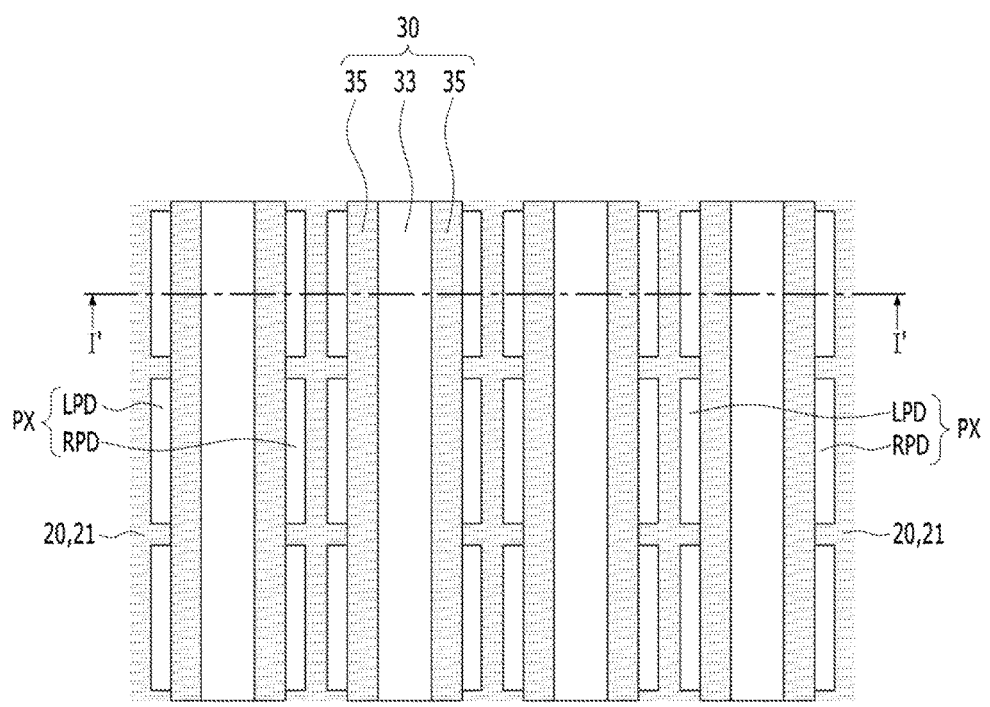
FIG. 2A is a top view schematically illustrating an image sensor in accordance with an embodiment of the present invention.
Figure 2B:
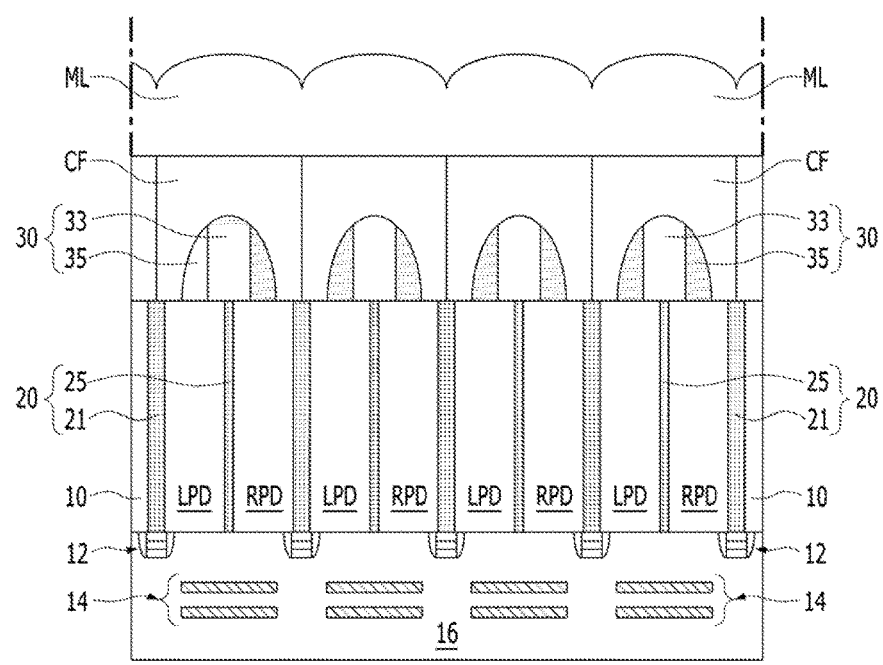
FIG. 2B is a longitudinal sectional view schematically illustrating the image sensor taken along line I-I' of FIG. 2A.
Figure 2C:
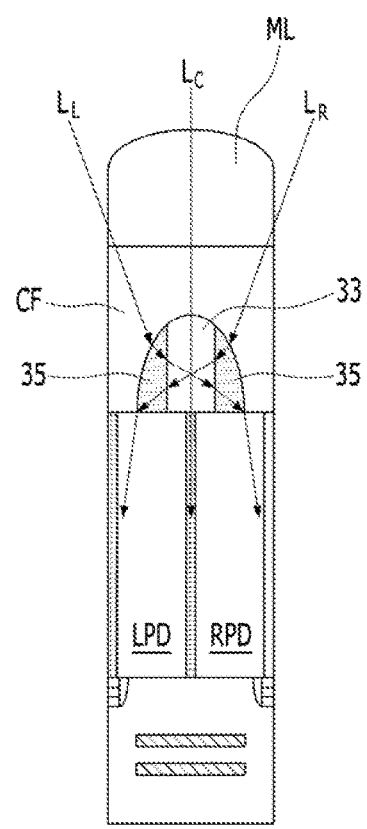
FIG. 2C is a longitudinal sectional view schematically illustrating one pixel to conceptually show light propagation paths in an image sensor in accordance with an embodiment of the present invention.

FIG. 2A is a top view schematically illustrating an image sensor in accordance with an embodiment of the present invention, FIG. 2B is a longitudinal sectional view schematically illustrating the image sensor taken along line of FIG. 2A, and FIG. 2C is a longitudinal sectional view schematically illustrating one pixel to conceptually show light propagation paths in the image sensor.

Referring to FIGS. 2A and 2B, the image sensor may include a plurality of isolation regions 20, a plurality of pixels PX, a plurality of transistors 12, a plurality of interconnection patterns 14, an interlayer insulating layer 16, a plurality of light refraction patterns 30, a plurality of color filters CF, and a plurality of micro-lenses ML. The isolation regions 20 and the pixels PX may be formed in a substrate 10. The transistors 12, the interconnection patterns 14, and the interlayer insulating layer 16 may be formed below a bottom surface of the substrate 10. The light refraction patterns 30, the color filters CF, and the micro-lenses ML may be formed on a top surface of the substrate 10. The pixels PX may be 2-dimensionally arrayed in the top view.

The substrate 10 may include a single crystalline silicon wafer or an epitaxially grown single crystalline silicon layer. However, it is noted that other suitable semiconductor materials may also be used as the substrate.

The isolation regions 20 may include a plurality of pixel isolation regions 21 and a plurality of PD isolation regions 25. For example, the pixel isolation regions 21 may define one pixel PD, and the PD isolation regions 25 may define a left photodiode LPD and a right photodiode RPD in the one pixel PX.

The pixel isolation regions 21 may optically and electrically isolate and define the respective pixels PX. The PD isolation regions may optically and electrically isolate and define the left photodiodes LPD and the right photodiodes RPD by separating the pixels PX. The isolation regions 20 may include deep trench isolation (DTI) regions or ion injected regions.

The photodiodes LPD and RPD may include the left photodiodes LPD and the right photodiodes RPD optically and electrically isolated from each other by the pixel isolation regions 21. One of the left photodiodes LPD and one of the right photodiodes RPD may form one pixel PX. That is, one photodiode pair having one left photodiode LPD and one right photodiode RPD may use or share the same color filter CF.

The transistors 12 may include an overflow transistor, a transfer transistor, a reset transistor, a driving transistor, and a select transistor, all of which may be formed below the bottom surface of the substrate 10. The overflow transistor and the transfer transistor may be partially vertically overlapped with at least one of the left photodiode LPD or the right photodiode.

The interconnection patterns 14 may transfer electrical signals generated from the photodiodes LPD and RPD to an image processing circuit, a display circuit, and the like. The interconnection patterns 14 may be made of a conducting material such as a metal. The interconnection patterns 14 may have various shapes having line shapes or via shapes.

The interlayer insulating layer 16 may cover the bottom surface of the substrate 10, the transistors 12, and the interconnection patterns 14. The interlayer insulating layer 16 may include at least one of a silicon oxide layer, a silicon nitride layer, a silicon oxy-nitride layer, or combinations thereof.

The light refraction patterns 30 may be extended in the same direction as the PD isolation regions 25 to be overlapped with the PD isolation regions 25 in the top view. The light refraction patterns 30 may include a center refraction pattern 33 in a center region, and side refraction patterns 35 on both sides of the center refraction pattern 33, respectively. The center refraction pattern 33 may be vertically aligned and overlapped with the PD isolation region 25. The center refraction pattern 33 may be vertically aligned with a portion of the left photodiode LPD and a portion of the right photodiode RPD. Each of the side refraction patterns 35 may be vertically aligned and overlapped with one of the left photodiode LPD and the right photodiode RPD, respectively. The light refraction patterns 30 may be formed in areas occupied by the pixels PX, respectively. The center refraction pattern 33 may have a shape in which a center of an upper surface thereof is convex upwardly, and both sidewalls thereof are vertical. The side refraction patterns 35 may have a sidewall spacer shape. Specifically, inner sides of the side refraction patterns 35 may be vertical, and outer sides of the side refraction patterns 35 may have a curved shape in which an upper horizontal width thereof is relatively narrower and a lower horizontal width thereof is relatively wider. More specifically, each of the side refractive patterns 35 may have three surfaces, a first flat bottom surface in contact with the top surface of the right or the left photodiodes, a vertical flat side surface in contact with one of the vertical side surfaces of the center refraction pattern 33, and a sideways concave side surface. The overall shape of the light refraction pattern 30 may be that of a one half of an ellipse with a flat bottom surface and a convex top surface.

The center refraction pattern 33 may be made of a material having a first refractive index less than a second refractive index of the side refraction patterns 35. In other words, the side refraction pattern 35 may be made of a material having the second refractive index greater than the first refractive index of the center refraction pattern 33. For example the center refraction pattern 33 may be made of a silicon oxide, and the side refraction patterns 35 may be made of a silicon nitride.

The color filters CF may be formed to correspond to the pixels PX, respectively. The color filters CF may correspond to the one pixel PX and the one photodiode pair. The one photodiode pair may include one left photodiode LPD and one right photodiode RPD. Interfaces of the color filters CF may be vertically aligned with the pixel isolation regions 21. The micro-lenses ML may correspond to the color filters CF, respectively.

Referring to FIG. 2C, when incident lights $L_L$ and $L_R$ diagonally enter from upper sides of the pixel PX to the photodiodes LPD and RPD, the incident lights $L_L$ and $L_R$ may be refracted by the light refraction pattern 30 such that incident angles of the lights $L_L$ and $L_R$ become smaller, causing a light loss of the incident lights $L_L$ and $L_R$ to be reduced. Accordingly, amount of the incident lights $L_L$ and $L_R$ can be more collected.

Specifically, the diagonal incident lights $L_L$ and $L_R$ may be refracted along arrows according to a refractive index difference among the color filter CF, the center refraction pattern 33, and the side refraction pattern 35, and may enter to each of the photodiodes LPD and RPD through the color filter CF, the center refraction pattern 33, and the side refraction pattern 35. Accordingly, although the incident angles of the incident lights $L_L$ and $L_R$ are increased, more amounts of the incident lights $L_L$ and $L_8$ can be accurately transferred to the photodiodes LPD and RPD, and autofocusing functions can be effectively implemented using the photodiodes LPD and RPD. Furthermore as the incident angles of the diagonal incident lights $L_L$ and $L_R$ can be more vertically changed, cross-talk between the photodiodes LPD and RPD can be reduced.

FIGS. 3A to 3H are longitudinal sectional views illustrating a method for an image sensor in accordance with an embodiment of the present invention.

Figure 3A:
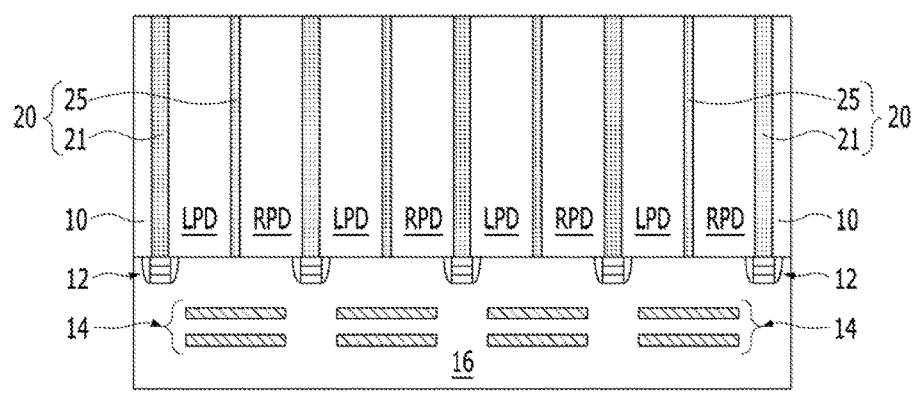
FIGS. 3A to 3H are longitudinal sectional views illustrating a method for forming an image sensor in accordance with an embodiment of the present invention.

Referring to FIG. 3A the method may include forming isolation regions 20 and photodiodes LPD and RPD in a substrate 10. The photodiodes LPD and RPD may be optically and electrically isolated from each other by the isolation regions 20. The isolation regions 20 may include pixel isolation regions 21 and PD isolation regions 25. The pixel isolation regions 21 may isolate pixels PX of the image sensor, respectively. The PD isolation regions 25 may isolate photodiodes LPD and RPD in the same pixel PX as a left photodiode LPD and a right photodiode RPD. Accordingly, the left photodiode LPD and the right photodiode RPD may form one pixel PX having the same color.

The forming of the photodiodes LPD and RPD may include injecting P-type ions and N-type ions into the substrate 10 by using an ion injecting process. For example, the P-type ions may include boron (B) ions, and N-type ions may include phosphorous (P) ions and/or arsenic (As) ions. The forming of the pixel isolation regions 21 may include forming deep trenches in the substrate 10, and filling the deep trenches with an insulating material. For example, the forming of the pixel isolation regions 21 may include performing a deep trench isolation (DTI) process. The PD isolation regions 25 may be formed using the DTI process or the ion injecting process. That is, the PD isolation regions 25 may be formed with the pixel isolation regions 21 at the same time, or may be formed by using another process at the different time.

The method may further include forming transistors 12 below a bottom side of the substrate 10, and forming an interlayer insulating layer 16 covering the bottom surface of the substrate 10 and the transistors 12. The forming of the interlayer insulating layer 16 may include forming an insulating material layer such as a silicon oxide layer using a deposition process. The method may further include forming interconnection patterns 14 surrounded by the interlayer insulating layer 16. For example, the interlayer insulating layer 16 may be multiple layers.

Figure 3B:
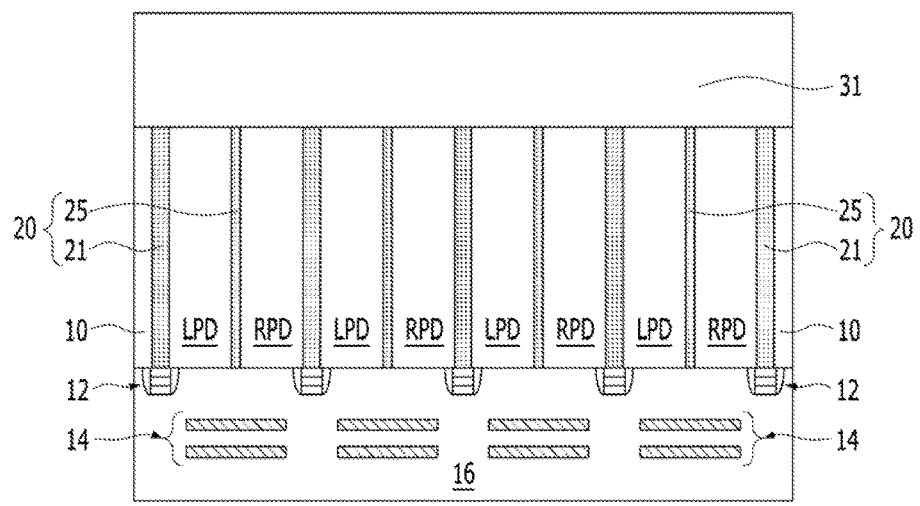

Referring to FIG. 3B, the method may further include forming a first insulating layer 31 on a top surface of the substrate 10. The forming of the first insulating layer 31 may include performing a deposition process or a coating process. For example, the first insulating layer may include a silicon oxide layer.

Figure 3C:
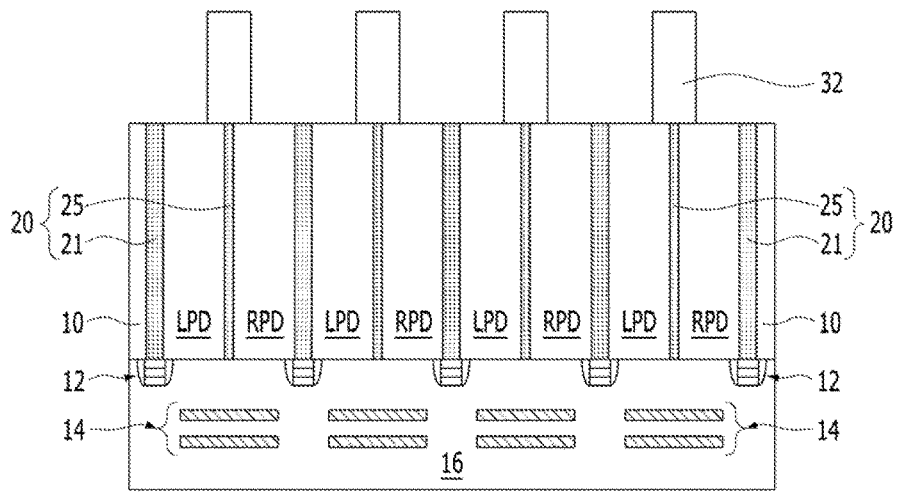

Referring to FIG. 3C, the method may further include patterning the first insulating layer 31 to form first insulating patterns 32. The patterning of the first insulating layer 31 may include performing a photolithography process and an etching process. The first insulating patterns 32 may be vertically aligned with the PD isolation regions 25 between the left photodiode LPD and the right photodiode RPD as an interface.

Figure 3D:
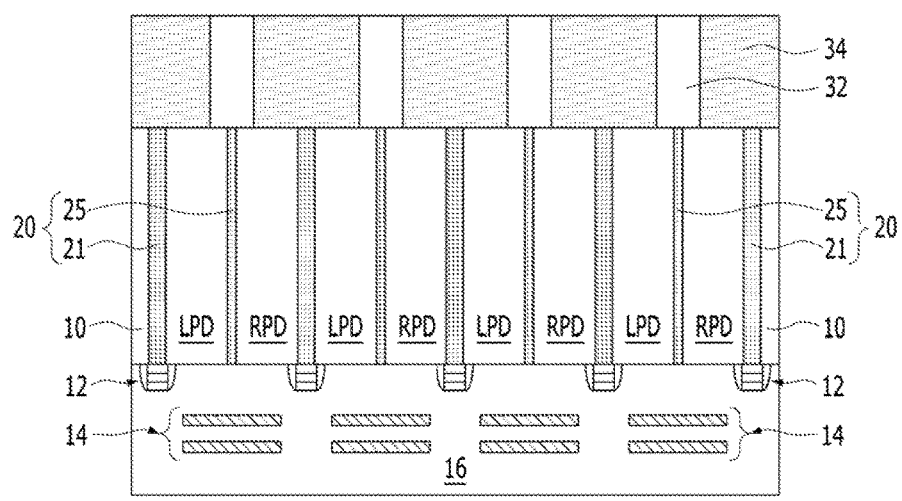

Referring to FIG. 3D, the method may further include forming a second insulating patterns 34 surrounding side surfaces of the first insulating patterns 32 on the top surface of the substrate 10. That is, the second insulating patterns 34 may be formed on the side surfaces of the first insulating patterns 32. The second insulating patterns 34 may have a greater optical refractive index than the first insulating patterns 32. In other words, the first insulating patterns 32 may have an optical refractive index relative less than the second insulating patterns 34. The forming of the second insulating patterns 34 may include forming a second insulating layer covering the first insulating patterns 32 on the substrate 10, and planarizing upper surfaces of the second insulating layer and the first insulating patterns 32 to be flat using a planarization process such as a chemical mechanical polishing (CMP) process.

Figure 3E:
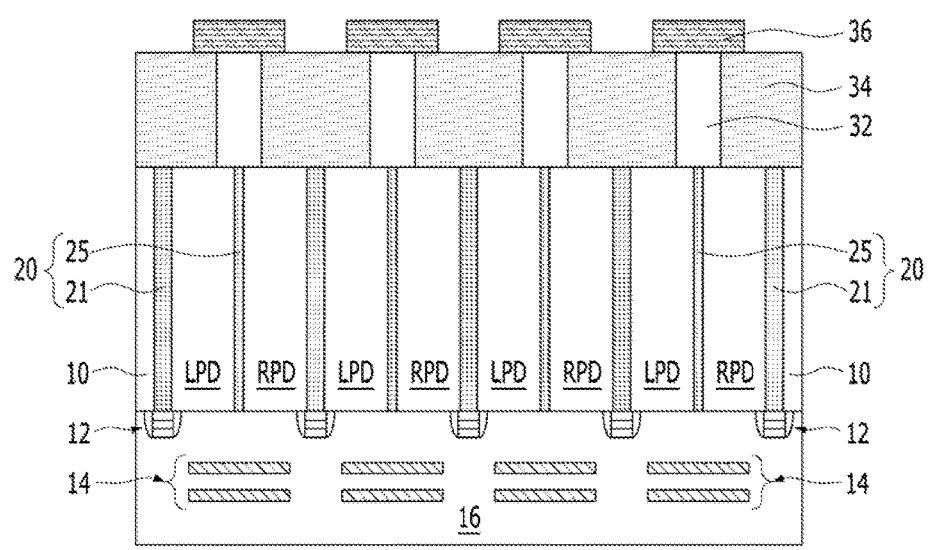

Referring FIG. 3E, the method may further include forming organic patterns 36 on the first insulating patterns 32. The organic patterns 36 may be vertically aligned with the first insulating patterns 32.

Figure 3F:
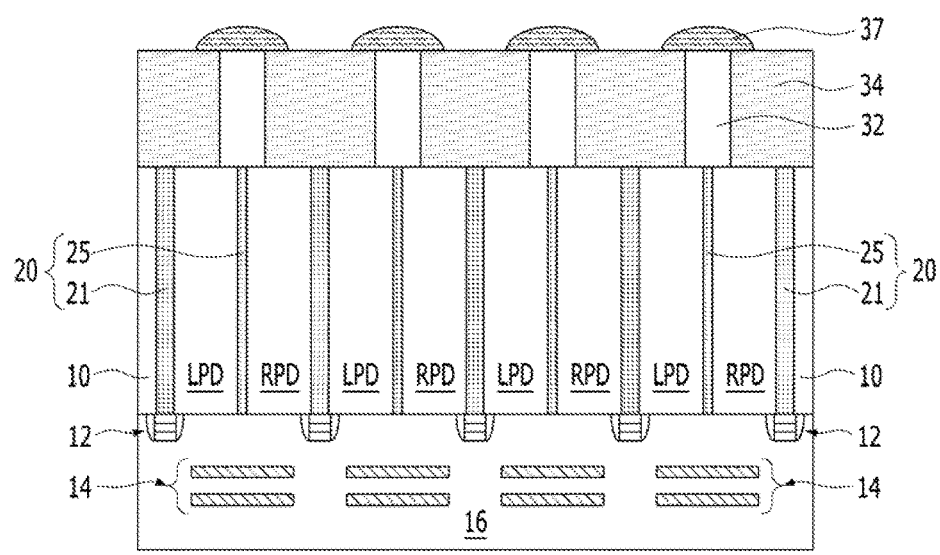

Referring to FIG. 3F, the method may further include forming mask patterns 37 having a lens shape by reflowing the organic patterns 36 using a thermal re low process.

Figure 3G:
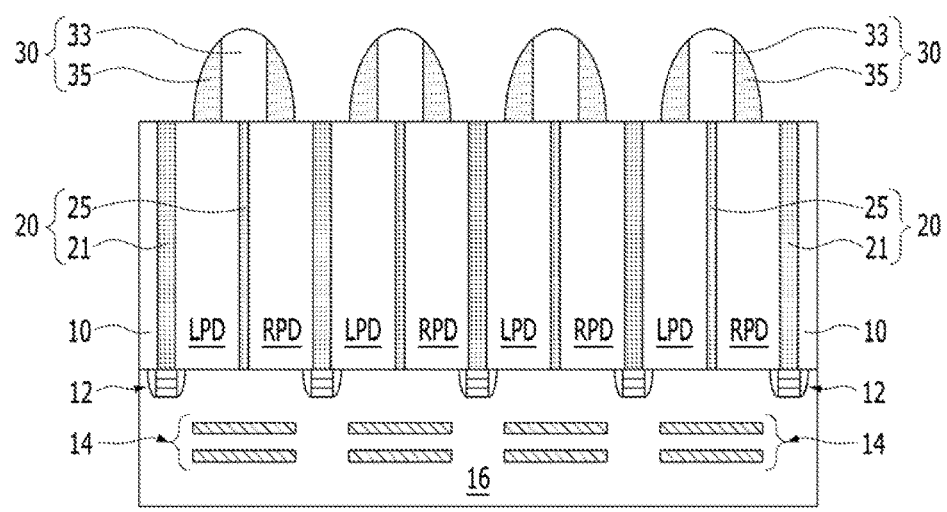

Referring to FIG. 3G, the method may further include performing an etching process to form light refraction patterns 30 using the mask patterns 37 as patterning masks. The etching process may be sufficiently and/or overly performed after removing all the mask patterns 37. The light refraction patterns 30 may include center refraction patterns 33 at center regions and side refraction patterns 35 on both sidewalls of the center refraction patterns 33. As mentioned above, the side refraction patterns 35 may have a greater refractive index than the center refraction patterns 33.

In some embodiments, the processes described in reference with FIGS. 3E and 3F may be omitted. For example, a method for forming an image sensor in accordance with an embodiment of the present invention may not include forming the organic patterns 36, but may include forming the light refraction patterns 30 shown in FIG. 3G using an etching process.

Figure 3H:
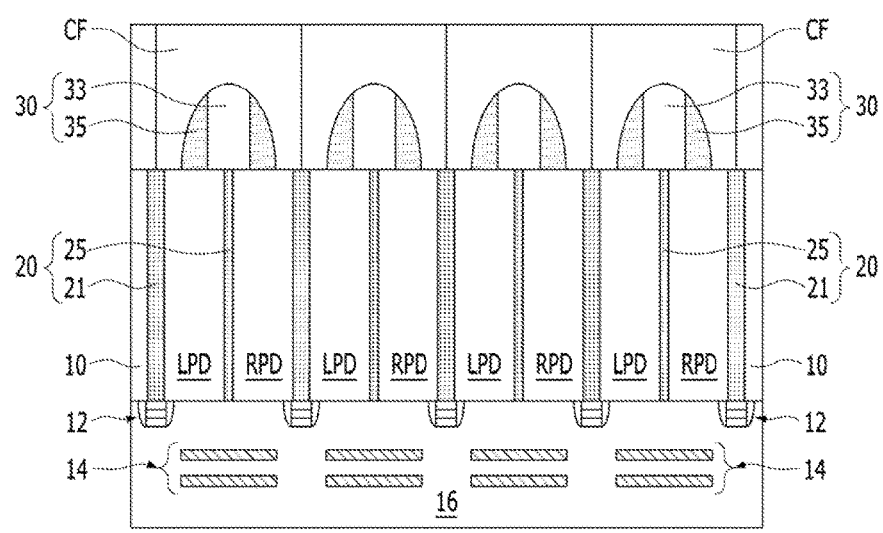

Referring to FIG. 3H, the method may further include forming color filters CF covering the light refraction patterns 30 on the substrate 10. Each color filters CF may correspond to the respective pixels PX. For example, the left photodiode LPD and the right photodiode RPD forming one photodiode pair may share the same color filter CF. Then referring to FIG. 2, the method may further include forming microlenses ML one-to-one corresponding to the color filters CF.

Figure 4:
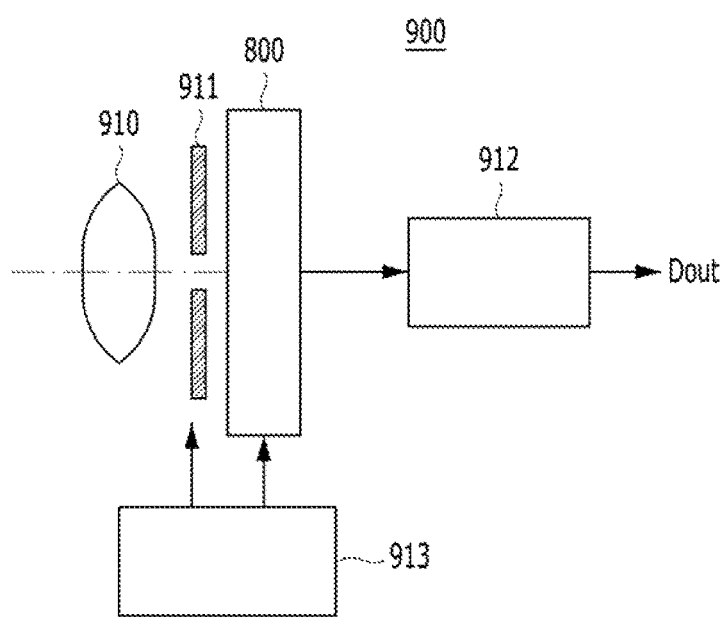
FIG. 4 is a diagram illustrating an electronic device including at least one image sensor in accordance with various embodiments of the present invention.

FIG. 4 is a diagram illustrating an electronic device including an image sensor in accordance with the embodiment of the present) invention.

Referring to FIG. 4, the electronic device 900 including the image sensor 800 in accordance with the embodiment of the present invention may include a camera capable of capturing a still image or a moving image. The electronic device 900 may include the image sensor 800 an optical system 910 (or an optical lens) a shutter unit 911, a controller 913 for controlling/driving the shutter unit 911, and a signal processor 912. The optical system 910 may guide optical image of a subject to a pixel array (e.g., "810" of FIG. 1) of the image sensor 800. The optical system 910 may include a plurality of optical lenses. The shutter unit 911 may control the length of time for exposing the image sensor 800 to light and shutting it off. The controller 913 may control a transfer operation of the image sensor 800 and a shutter operation of the shutter unit 911. The signal processor 912 may process diverse kinds of signals outputted from the image sensor 800. Image signals Dout may be outputted from the signal processor 912 after the signal processing may be stored in a storage medium (not shown), such as a memory, or outputted to a monitor (not shown).

According to the image sensor in accordance with embodiments of the present invention, although the angle of the incident lights entering to the photodiodes is increased, the loss of light amounts is reduced, so that the image sensor can more accurately sense the optical information.

According to the image sensor in accordance with embodiments of the present invention, the incident light more vertically can enter the photodiodes to make it possible to improve the auto-focus function and reduce the crosstalks between the photodiodes.

Other effects of the various embodiments of the present invention that are not described herein may be understood from the detailed description of the inventive concepts.

While the present invention has been described with respect to the specific embodiments, it will be apparent to those skilled in the art that various changes and modifications may be made without departing from the spirit and scope of the invention as defined in the following claims.

What is claimed is:

1. An image sensor comprising:
a photodiode formed in a substrate;
a light refraction pattern formed on the photodiode;
a color filter covering the light refraction pattern; and
a micro-lens formed on the color filter,
wherein the photodiode comprises a left photodiode and a right photodiode isolated from each other by a PD isolation region, and
wherein the light refraction pattern, the PD isolation pattern, and a center of the micro-lens are vertically aligned with each other,
wherein the light refraction pattern comprises a center refraction pattern and side refraction patterns on both sidewalls of the center refraction pattern,
wherein the center refraction pattern and the side refraction patterns form a hemispherical pattern together, the hemispherical pattern having a convex top surface and a flat bottom surface,
wherein the flat bottom surfaces of the center refraction pattern and the side refraction patterns are co-planar.

2. The image sensor of claim 1,
wherein the PD isolation region and the light refraction pattern extend in a line type in a top view, and
wherein a horizontal width of the photodiode is greater than a horizontal width of the light refraction pattern.

3. The image sensor of claim 1,
wherein the center refraction pattern is vertically aligned with the PD isolation region, and
wherein the side refraction patterns are aligned with the left and the right photodiode, respectively.

4. The image sensor of claim 3,
wherein the center refraction pattern has a first optical refractive index, the side refractive patterns has a second optical refractive index, and the first optical refractive index is less than the second refractive index.

5. The image sensor of claim 3,
wherein each of the side refractive patterns has a flat bottom surface, a vertical flat side surface, and a vertical curved side surface.

6. The image sensor of claim 3,
wherein the side refractive patterns have a spacer shape with a horizontal width which is getting wider from an uppermost to a lowermost, wherein a lowermost width of the bottom surface of each of the side refractive patterns is widest.

7. A method for forming an image sensor, the method comprising:
forming a PD isolation region in a substrate to define a left photodiode and a right photodiode;
forming a center refraction pattern on a top surface of the substrate to be vertically aligned with the PD isolation region;
forming side refraction patterns on sidewalls of the center refraction pattern to be vertically aligned with the left photodiode and the right photodiode, respectively;
forming a color filter covering the center refraction pattern and side refraction patterns; and
forming a micro-lens on the color filter,
wherein the forming of the center refraction pattern and the side refraction patterns comprises:
forming a first insulating pattern on the top surface of the substrate;
patterning the first insulating pattern;
forming a second insulating pattern on sidewalls of the patterned first insulating pattern; and
patterning the second insulating patterns.

8. The method of claim 7,
wherein the first insulating pattern has an optical refractive index relatively less than that of the second insulating pattern.

9. The method of claim 7,
wherein the center refraction pattern formed by patterning the first insulating pattern, and the side refraction patterns formed by patterning the second insulating patterns.

10. The method of claim 9,
wherein the center refraction pattern is vertically aligned with the PD isolation region, and partially aligned with the left photodiode and the right photodiode.

11. The method of claim 9,
wherein the side refraction patterns are vertically aligned with one of the left photodiode and the right photodiode, respectively.

12. The method of claim 7,
wherein forming the center refraction pattern and the side refraction patters comprises:
forming a mask pattern on the first insulating pattern and the second insulating pattern, and
patterning the first insulating pattern and the second insulating pattern by performing an etching process using the mask pattern as an etching mask.

13. The method of claim 12,
wherein the forming the mask pattern comprises:
forming an organic pattern on the first insulating pattern and the second insulating pattern, and
reflowing the organic pattern.

14. The method of claim 7,
wherein the center refraction pattern and the side refraction patterns two dimensionally extends with the PD isolation region in a same direction in a top view.

15. An image sensor comprising:
a photodiode formed in a substrate;
a light refraction pattern formed on the photodiode;
a color filter covering the light refraction pattern; and
a micro-lens formed on the color filter,
wherein the light refraction pattern, the PD isolation pattern, and a center of the micro-lens are vertically aligned with each other,
wherein the light refraction pattern comprises a center refraction pattern and side refraction patterns on both sidewalls of the center refraction pattern,
wherein the center refraction pattern has a convex top surface, vertical flat side surfaces, and a horizontally flat bottom surface,
wherein each of the side refractive patterns has a horizontally flat bottom surface, an inner vertical flat side surface, and an outer vertical curved side surface, wherein the bottom surfaces of the center refraction pattern and the side refraction patterns are co-planar.

16. The image sensor of claim 15,
wherein the side refractive patterns have a spacer shape having a first horizontal width at a top-near portion of the spacer, a second horizontal width at a middle portion of the spacer, and a third horizontal width at a bottom portion,
wherein the first horizontal width is narrower than the second horizontal width and the third horizontal width is wider than the second horizontal width, and
wherein inner sides of the side refraction patterns are vertical and outer sides of the side refraction patterns are curved.

17. The image sensor of claim 15,
wherein the photodiode comprises a left photodiode and a right photodiode isolated each other by a PD isolation region,
wherein the light refraction pattern extends onto other adjacent photodiodes in a line type in a top view.

18. The image sensor of claim 15,
wherein a horizontal width of the photodiode is greater than a horizontal width of the light refraction pattern.

* * * * *